(12) United States Patent
Yoon et al.

(10) Patent No.: US 8,487,528 B2
(45) Date of Patent: Jul. 16, 2013

(54) ORGANIC LIGHT EMITTING DIODE DEVICE HAVING AN YTTERBIUM ALLOY ELECTRODE

(75) Inventors: Seok-Gyu Yoon, Yongin (KR); Young-Woo Song, Yongin (KR); Kyu-Hwan Hwang, Yongin (KR); Jae-Heung Ha, Yongin (KR); Jong-Hyuk Lee, Yongin (KR); Won-Jong Kim, Yongin (KR); Yong-Tak Kim, Yongin (KR); Chang-Ho Lee, Yongin (KR); Il-Soo Oh, Yongin (KR); Hyung-Jun Song, Yongin (KR); Hee-Joo Ko, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 33 days.

(21) Appl. No.: 12/926,699

(22) Filed: Dec. 6, 2010

(65) Prior Publication Data
US 2011/0133633 A1 Jun. 9, 2011

(30) Foreign Application Priority Data
Dec. 9, 2009 (KR) ........................ 10-2009-0121920

(51) Int. Cl.
*H01L 51/00* (2006.01)
*H01L 51/30* (2006.01)

(52) U.S. Cl.
USPC .......................................... 313/504; 313/506

(58) Field of Classification Search
USPC ....................................................... 313/504
See application file for complete search history.

(56) References Cited

U.S. PATENT DOCUMENTS

| 6,280,860 | B1 | 8/2001 | Ueda et al. | |
| 2004/0189189 | A1* | 9/2004 | Burroughes et al. | 313/504 |
| 2005/0052118 | A1 | 3/2005 | Lee et al. | |
| 2006/0280964 | A1* | 12/2006 | Liu | 428/690 |
| 2008/0157663 | A1* | 7/2008 | Sung et al. | 313/504 |

FOREIGN PATENT DOCUMENTS

| KR | 10 2001-0109321 A | 12/2001 |
| KR | 10 2007-0078599 A | 8/2007 |
| KR | 10 2008-0042887 A | 5/2008 |
| KR | 10 2008-0061732 A | 7/2008 |
| WO | WO 2006-132226 A1 | 12/2006 |

OTHER PUBLICATIONS

Lai, et al.; Applications of Ytterbium in organic light-emitting devices as high performance and transparent electrodes; Chemical Physics Letters; 2002; pp. 128-133; Chemical Physics Letters 336; Elsevier.

(Continued)

*Primary Examiner* — Karabi Guharay
(74) *Attorney, Agent, or Firm* — Lee & Morse, P.C.

(57) ABSTRACT

An organic light emitting diode device including a first electrode; a second electrode facing the first electrode; and an emitting layer interposed between the first electrode and the second electrode, wherein the first electrode includes an ytterbium (Yb) alloy represented by the following Chemical Formula 1:

$$Yb\text{-}M \quad (1), \text{ and}$$

in Chemical Formula 1, M is a metal including at least one of silver (Ag), calcium (Ca), chromium (Cr), iron (Fe), cobalt (Co), nickel (Ni), copper (Cu), molybdenum (Mo), ruthenium (Ru), indium (In), and tungsten (W).

20 Claims, 10 Drawing Sheets

OTHER PUBLICATIONS

Ma, et al.; Novel transparent Yb-based cathodes for top-emitting organic light emitting devices with high performance; Applied Surface Science; 2006; pp. 3580-3584; Applied Surface Science 252; Elsevier.

Ma, et al.; Experimental study of the organic light emitting diode with a p-type silicon anode; Thin Solid Films; 2006; pp. 665-668; Thin Solid Films 496; Elsevier.

Xie, et al.; Transparent organic light-emitting devices with LiF/Yb: Ag cathode; Thin Solid Films; 2007; pp. 6975-6977; Thin Solid Films 515; Elsevier.

Zhang, et al.; Transparent white organic light-emitting devices with a LiF/Yb: Ag cathode; Optics Letters; Apr. 15, 2009; pp. 1174-1176; vol. 34, No. 8; Optical Society of America; United States.

* cited by examiner

ORGANIC LIGHT EMITTING DIODE DEVICE HAVING AN YTTERBIUM ALLOY ELECTRODE

BACKGROUND

1. Field

Embodiments relate to an organic light emitting diode device.

2. Description of the Related Art

Cathode ray tubes (CRT) have been replaced by liquid crystal displays (LCD) in response to the desirability of a light-weight and slim monitor or television.

However, liquid crystal displays (LCD) are non-emissive elements requiring a separate backlight and have limits on response speed, viewing angle, and the like.

Recently, as a display device for overcoming such limitations, an organic light emitting diode device (OLED device) has drawn attention.

An organic light emitting diode device includes two electrodes and an emitting layer interposed therebetween. Electrons injected from one electrode are combined with holes injected from the other electrode in an emitting layer to generate excitons, which release energy by emitting light.

Light emitted from an emitting layer may be transmitted through at least one of the two electrodes. Accordingly, light emitted from the emitting layer may be lost, i.e., absorbed by the electrodes.

SUMMARY

Embodiments are directed to an organic light emitting diode device, which represents advances over the related art.

It is a feature of an embodiment to provide an organic light emitting diode device including an electrode having low resistance and high transmittance.

It is another feature of an embodiment to provide an OLED device including an electrode having improved light transmittance to provide the OLED device with excellent light efficiency.

At least one of the above and other features and advantages may be realized by providing an organic light emitting diode device including a first electrode; a second electrode facing the first electrode; and an emitting layer interposed between the first electrode and the second electrode, wherein the first electrode includes an ytterbium (Yb) alloy represented by the following Chemical Formula 1:

$$Yb\text{-}M \qquad (1), \text{and}$$

in Chemical Formula 1, M is a metal including at least one of silver (Ag), calcium (Ca), chromium (Cr), iron (Fe), cobalt (Co), nickel (Ni), copper (Cu), molybdenum (Mo), ruthenium (Ru), indium (In), and tungsten (W).

The ytterbium alloy may include Yb and M at a Yb:M ratio of about 20:1 to about 1:20.

The ytterbium alloy may include Yb and M at a Yb:M ratio of about 5:1 to about 1:6.

The ytterbium alloy may include Yb and M at a Yb:M ratio of about 1:1.

The first electrode may have a light transmittance of about 40% or greater in a visible ray region.

The first electrode may have a light transmittance of about 40% to about 95% in a visible ray region.

The first electrode may have a sheet resistance of about 500 $\Omega/cm^2$ or less at a thickness of about 50 Å to about 500 Å.

The first electrode may have a sheet resistance of about 1 $\Omega/cm^2$ to about 500 $\Omega/cm^2$ or less at a thickness of about 50 Å to about 500 Å.

The first electrode may have a thickness about 50 Å to about 500 Å.

The ytterbium alloy may include an ytterbium-silver alloy (YbAg).

The first electrode may include a first layer including an ytterbium (Yb) alloy represented by Chemical Formula 1, and a second layer including at least one of silver (Ag), calcium (Ca), chromium (Cr), iron (Fe), cobalt (Co), nickel (Ni), copper (Cu), molybdenum (Mo), ruthenium (Ru), indium (In), tungsten (W), and alloys thereof.

The first layer may have a thickness of about 5 Å to about 200 Å and the second layer may have a thickness of about 50 Å to about 300 Å.

The first layer may include an ytterbium-silver alloy (YbAg) and the second layer may include silver (Ag) or a silver alloy.

The second electrode may include a transparent conductive layer.

The second electrode may include a reflective layer and the emitting layer may be configured to emit white light.

The second electrode may further include a transparent conductive layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
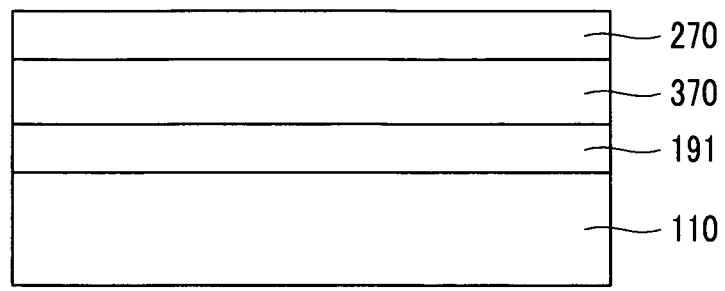
FIG. 1 illustrates a cross-sectional view of an organic light emitting diode device according to an embodiment.

Korean Patent Application No. 10-2009-0121920, filed on Dec. 9, 2009, in the Korean Intellectual Property Office, and entitled: "Organic Light Emitting Diode Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

This disclosure will be described more fully hereinafter with reference to the accompanying drawings, in which exemplary embodiments of this disclosure are shown. As those skilled in the art would realize, the described embodiments may be modified in various different ways, all without departing from the spirit or scope of this disclosure.

Referring to FIG. 1, an organic light emitting diode device according to an embodiment is described in detail.

FIG. 1 illustrates a cross-sectional view of an organic light emitting diode device according to an embodiment.

Referring to FIG. 1, the organic light emitting diode device according to the present embodiment may include a substrate 110, a lower electrode 191 disposed on the substrate 110, an upper electrode 270 facing the lower electrode 191, and a light emitting member 370 interposed between the lower electrode 191 and upper electrode 270.

The substrate 110 may include, e.g., a glass substrate, silicon wafer, polymer film, and the like.

One of the lower electrode 191 and the upper electrode 270 may be a cathode and the other one may be an anode.

At least one of the lower electrode 191 and the upper electrode 270 may be a transparent electrode. When the lower electrode 191 is the transparent electrode, the OLED device may be a bottom emission structure transmitting light through the substrate 110. When the upper electrode 270 is the transparent electrode, the OLED device may be a top emission structure transmitting light toward the opposite side of, i.e., away from, the substrate 110. When both lower electrode 191 and upper electrode 270 are transparent electrodes, light may be transmitted both toward the substrate 110 and toward the opposite side of, i.e., away from, the substrate 110.

The transparent electrode may be made of an ytterbium (Yb) alloy.

The ytterbium (Yb) alloy may be represented by the following Chemical Formula 1:

$$Yb\text{-}M \quad (1)$$

In Chemical Formula 1, M may be a metal including, e.g., silver (Ag), calcium (Ca), chromium (Cr), iron (Fe), cobalt (Co), nickel (Ni), copper (Cu), molybdenum (Mo), ruthenium (Ru), indium (In), tungsten (W), alloys thereof, and/or combinations thereof.

Since ytterbium (Yb) has a relatively low work function, e.g., about 2.6 eV, it may be easy to inject electrons into the emitting layer. Further, since ytterbium has a low refractive index and absorbance in the visible ray region, light transmittance may be high. Also, when ytterbium (Yb) is formed in a thin configuration, it may still have a bulk characteristic. Therefore, a stable thin film including ytterbium may be formed.

Since silver (Ag), calcium (Ca), chromium (Cr), iron (Fe), cobalt (Co), nickel (Ni), copper (Cu), molybdenum (Mo), ruthenium (Ru), indium (In), and tungsten (W) are low-resistance metals, it is possible to decrease resistance of an electrode by forming such a metal into an alloy with ytterbium (Yb).

When an ytterbium alloy including ytterbium (Yb) and a low-resistance metal is used to form the transparent electrode, the transparent electrode may have a low-resistance characteristic as well as high light transmittance by maintaining low refractive index and absorbance even when formed in a thin configuration.

The transparent electrode including an ytterbium alloy may have a light transmittance of about 40% or greater in the visible ray region. In an implementation, the transparent electrode including an ytterbium alloy may have a light transmittance of about 40% to about 95%.

Furthermore, while having high transmittance, the ytterbium alloy may also have a low sheet resistance of, e.g., about 500 $\Omega/cm^2$ or less, based on a thickness of about 50 Å to about 500 Å. In an implementation, the sheet resistance of the ytterbium alloy may be, e.g., about 1 $\Omega/cm^2$ to about 500 $\Omega/cm^2$ in the above thickness range.

The ytterbium alloy may be composed in a ratio of ytterbium to metal of about 20:1 to about 1:20. In an implementation, the ytterbium alloy may be composed in a ratio of ytterbium to metal of about 5:1 to about 1:6. In another implementation, the ytterbium alloy may be composed in a ratio of ytterbium to metal of about 1:1.

The transparent electrode formed of the ytterbium alloy may have a thickness of about 50 Å to about 500 Å. Maintaining the thickness of the transparent electrode at about 50 Å to about 500 Å may help ensure that both light transmittance and low-resistance characteristics may be satisfied.

When both the lower electrode 191 and the upper electrode 270 are transparent electrodes, one of the electrodes may be an electrode formed of the ytterbium alloy described above; and the other may be an electrode formed of a transparent conductive oxide. The transparent conductive oxide may include, e.g., indium tin oxide (ITO) and/or indium zinc oxide (IZO).

When only one of the lower electrode 191 and the upper electrode 270 is a transparent electrode, the transparent electrode may be formed of the ytterbium alloy described above and the other may be an opaque conductive layer. The opaque conductive layer may be formed of, e.g., aluminum (Al), copper (Cu), molybdenum (Mo), silver (Ag), and/or combinations thereof.

The light emitting member 370 may have a multi-layer structure including, e.g., an emitting layer and an auxiliary layer for improving luminous efficiency of the emitting layer.

The emitting layer may be formed of, e.g., an organic material or a mixture of an organic material and an inorganic material. The emitting layer may inherently emit light expressing a color such as one of the three primary colors of red, green, and blue. In an implementation, the emitting layer may include, e.g., a polyfluorene derivative, a (poly)paraphenylenevinylene derivative, a polyphenylene derivative, polyvinylcarbazole, polythiophene derivative, and/or polymer materials doped with, e.g., a perylene-based dye, a cumarine-based dye, a rhodamine-based dye, rubrene, perylene, 9,10-diphenylanthracene, tetraphenylbutadiene, Nile red, coumarin, quinacridone, and the like. The organic light emitting diode display may display a desired image by spatial summing primary colored lights emitted from the emitting layer.

The auxiliary layers may include, e.g., an electron transport layer and a hole transport layer for balancing electrons and holes and an electron injection layer and a hole injection layer for enhancing injection of electrons and holes. In an implementation, the auxiliary layer may include one layer or two or more layers selected from the above described layers.

Hereafter, an organic light emitting diode device manufactured according to another embodiment will be described by referring to FIG. 2. What is overlapped with the previous embodiment will not be described herein.

Figure 2:
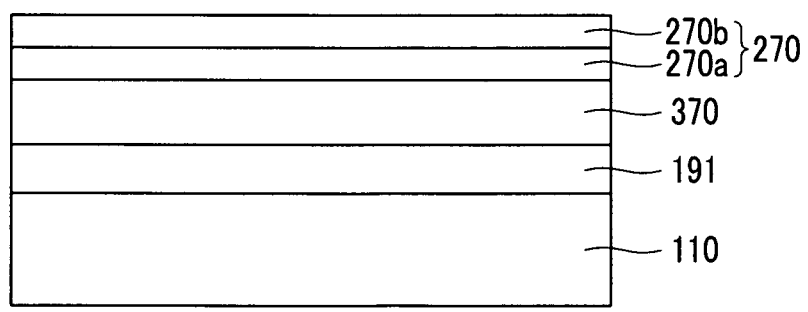
FIG. 2 illustrates a cross-sectional view of an organic light emitting diode device according to another embodiment.

FIG. 2 illustrates a cross-sectional view of an organic light emitting diode device according to another embodiment.

Referring to FIG. 2, the organic light emitting diode device according to the present embodiment may include a substrate 110, a lower electrode 191 disposed on the substrate 110, an upper electrode 270 facing the lower electrode 191 and including a lower layer 270a and an upper layer 270b, and a light emitting member 370 interposed between the lower electrode 191 and upper electrode 270.

Different from the previous embodiment, an upper electrode 270 of the present embodiment may have a multi-layer structure including the lower layer 270a and the upper layer 270b.

The lower layer 270a may be made of an ytterbium (Yb) alloy.

The Ytterbium (Yb) alloy may be represented by the following Chemical Formula 1:

Yb-M                                (1)

In Chemical Formula 1, M may be a metal including, e.g., silver (Ag), calcium (Ca), chromium (Cr), iron (Fe), cobalt (Co), nickel (Ni), copper (Cu), molybdenum (Mo), ruthenium (Ru), indium (In), tungsten (W), alloys thereof, and/or combinations thereof.

Even when formed in a thin configuration, the ytterbium alloy may maintain a low refractive index and a low absorbance, so that it is possible to have a low-resistance characteristic while increasing light transmittance.

The upper layer 270b may include, e.g., silver (Ag), calcium (Ca), chromium (Cr), iron (Fe), cobalt (Co), nickel (Ni), copper (Cu), molybdenum (Mo), ruthenium (Ru), indium (In), tungsten (W), alloys thereof, and/or combinations thereof. Since these metals are low-resistance metals having a resistivity of, e.g., about 15 μΩcm or less, resistance of the electrode may be decreased.

The lower layer 270a may have a thickness of about 5 Å to about 200 Å. The upper layer 270b may have a thickness of about 50 Å to about 300 Å.

By including both the lower layer 270a formed of the ytterbium alloy and the upper layer 270b formed of the low-resistance metal, resistance of the upper electrode 270 may be decreased due to the presence of the low-resistance metal while securing high light transmittance due to the presence of the ytterbium alloy.

Although the transparent electrode is described as being the upper electrode 270 in the present embodiment, this disclosure is not limited thereto; and the lower electrode 191 may be the transparent electrode. In this case, the lower electrode 191 may be formed of multiple layers including a layer formed of the ytterbium alloy and a layer formed of the low-resistance metal.

Also, when both the upper electrode 270 and lower electrode 191 are transparent electrodes, one of the upper electrode 270 and the lower electrode 191 may be formed of multiple layers, including a layer formed of the ytterbium alloy and a layer formed of the low-resistance metal. The other one may be formed of a transparent conductive material, e.g., a transparent conductive oxide.

Hereafter, an organic light emitting diode device manufactured according to yet another embodiment will be described by referring to FIG. 3. What is overlapped with the previous embodiment will not be described herein.

Figure 3:
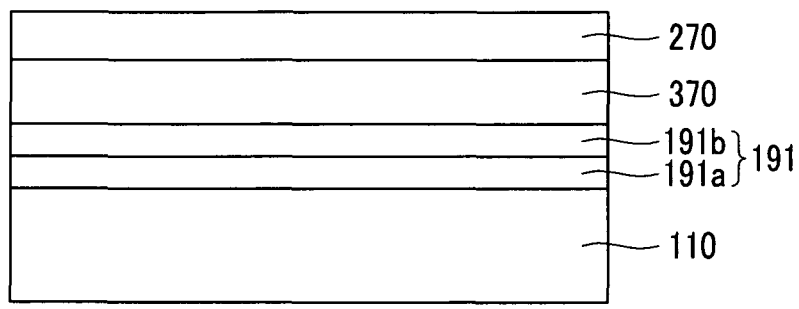
FIG. 3 illustrates a cross-sectional view of an organic light emitting diode device according to yet another embodiment.

FIG. 3 illustrates a cross-sectional view of an organic light emitting diode device according to yet another embodiment.

Referring to FIG. 3, the organic light emitting diode device according to the present embodiment may include a substrate 110, a lower electrode 191 disposed on the substrate 110 and including a reflective layer 191a and a transparent conductive layer 191b, an upper electrode 270 facing the lower electrode 191, and a light emitting member 370 interposed between the lower electrode 191 and the upper electrode 270.

Different from the previous embodiment, the organic light emitting diode device according to the present embodiment may include the lower electrode 191 formed of multiple layers including, e.g., the reflective layer 191a and the transparent conductive layer 191b, and the upper electrode 270 formed of the above-described ytterbium alloy.

The reflective layer 191a may be formed of a opaque metal, e.g., aluminum (Al), copper (Cu), molybdenum (Mo), silver (Ag), and/or combinations thereof. The transparent conductive layer 191b may be formed of a transparent conductive material, e.g., indium tin oxide and/or indium zinc oxide.

The reflective layer 191a may cause a microcavity effect along with the ytterbium alloy upper electrode 270. The microcavity effect refers to an effect in which light is repeatedly reflected between a reflective layer and a transparent layer (or transflective layer) spaced apart by a predetermined distance to thereby amplify light of a specific wavelength.

The lower electrode 191 including the reflective layer 191a may form the microcavity structure that greatly modifies the light emitting characteristic of light emitted from the emitting layer. Accordingly, the emission of light of a wavelength corresponding to a resonance wavelength of the microcavity may be enhanced through the upper electrode 270; and light of other wavelengths may be suppressed. The enhancement of the light of the specific wavelength and the suppression of light emission may be determined based on a distance between the lower electrode 191 and the upper electrode 270. The distance between the lower electrode 191 and the upper electrode 270 may be controlled by adjusting a thickness of the light emitting member 370; and as a result, light of specific wavelengths may be enhanced or suppressed. This disclosure, however, is not limited thereto; and the distance between the lower electrode 191 and the upper electrode 270 may be controlled by other suitable methods.

The emitting layer of the light emitting member 370 may emit white light. The white light may be emitted by combining red, green, and blue emitting layers.

The following examples illustrate this disclosure in more detail. These examples, however, should not in any sense be interpreted as limiting the scope of this disclosure.

Fabrication of Organic Light Emitting Element

EXAMPLE 1-1

ITO was laminated on a glass substrate, followed by patterning to form a bottom electrode. Then, tris(8-hydroxyquinoline) aluminum (Alq3) was deposited as an electron transport layer. As an emitting layer, Alq3 doped with 1 wt % of coumarin 6 was co-deposited thereon. As a hole injection layer and a hole transport layer, N,N-dinaphthalene-1-yl-N, N-diphenyl-benzidine (NPB) was deposited. Then, a ytterbium (Yb)-silver (Ag) alloy was formed at a 5:1 ratio to a 100 Å thickness by thermal evaporation to form a top electrode.

EXAMPLE 1-2

An organic light emitting element was fabricated according to the same method as in Example 1-1, except that the ytterbium (Yb)-silver (Ag) alloy was formed at a 3:1 ratio instead of 5:1 ratio.

EXAMPLE 1-3

An organic light emitting element was fabricated according to the same method as in Example 1-1, except that the ytterbium (Yb)-silver (Ag) alloy was formed at a 2:1 ratio instead of 5:1 ratio.

EXAMPLE 1-4

An organic light emitting element was fabricated according to the same method as in Example 1-1, except that the ytterbium (Yb)-silver (Ag) alloy was formed at a 1:1 ratio instead of 5:1 ratio.

EXAMPLE 1-5

An organic light emitting element was fabricated according to the same method as in Example 1-1, except that the ytterbium (Yb)-silver (Ag) alloy was formed at a 1:1.5 ratio instead of 5:1 ratio.

EXAMPLE 1-6

An organic light emitting element was fabricated according to the same method as in Example 1-1, except that the ytterbium (Yb)-silver (Ag) alloy was formed at a 1:2 ratio instead of 5:1 ratio.

EXAMPLE 1-7

An organic light emitting element was fabricated according to the same method as in Example 1-1, except that the ytterbium (Yb)-silver (Ag) alloy was formed at a 1:3 ratio instead of 5:1 ratio.

EXAMPLE 1-8

An organic light emitting element was fabricated according to the same method as in Example 1-1, except that the ytterbium (Yb)-silver (Ag) alloy was formed at a 1:4 ratio instead of 5:1 ratio.

EXAMPLE 1-9

An organic light emitting element was fabricated according to the same method as in Example 1-1, except that the ytterbium (Yb)-silver (Ag) alloy was formed at a 1:6 ratio instead of 5:1 ratio.

EXAMPLE 2-1

ITO was laminated on a glass substrate, followed by patterning to form a bottom electrode. Then, tris(8-hydroxyquinoline) aluminum (Alq3) was deposited as an electron transport layer. As an emitting layer, Alq3 doped with 1 wt % of coumarin 6 was co-deposited thereon. As a hole injection layer and a hole transport layer, N,N-dinaphthalene-1-yl-N, N-diphenyl-benzidine (NPB) was deposited. Then, a ytterbium (Yb)-silver (Ag) alloy was formed at a 5:1 ratio to a 40 Å thickness and silver (Ag) was deposited to a 70 Å thickness by thermal evaporation to form a top electrode.

EXAMPLE 2-2

An organic light emitting element was fabricated according to the same method as in Example 2-1, except that the ytterbium (Yb)-silver (Ag) alloy was formed at a 3:1 ratio instead of 5:1 ratio.

EXAMPLE 2-3

An organic light emitting element was fabricated according to the same method as in Example 2-1, except that the ytterbium (Yb)-silver (Ag) alloy was formed at a 2:1 ratio instead of 5:1 ratio.

EXAMPLE 2-4

An organic light emitting element was fabricated according to the same method as in Example 2-1, except that the ytterbium (Yb)-silver (Ag) alloy was formed at a 1:1 ratio instead of 5:1 ratio.

COMPARATIVE EXAMPLE 1

An organic light emitting element was fabricated according to the same method as in Example 1-1, except that pure ytterbium was deposited to a 100 Å thickness instead of the ytterbium (Yb)-silver (Ag) alloy.

COMPARATIVE EXAMPLE 2

An organic light emitting element was fabricated according to the same method as in Example 1-1, except that pure aluminum was deposited to a 100 Å thickness instead of the ytterbium (Yb)-silver (Ag) alloy.

COMPARATIVE EXAMPLE 3

An organic light emitting element was fabricated according to the same method as in Example 2-1, except that pure ytterbium (Yb) was deposited to a 40 Å thickness and pure aluminum (Al) was deposited to a 70 Å thickness instead of sequentially depositing a ytterbium (Yb)-silver (Ag) alloy and silver (Ag).

Evaluation—1

Resistance characteristics of top electrodes of the organic light emitting elements fabricated according to Examples 1-1 to 1-9 and Comparative Examples 1 and 2 were assessed. Herein, sheet resistance was measured based on 4-point probe method.

This will be described by referring to FIG. 4 and Table 1.

Figure 4:
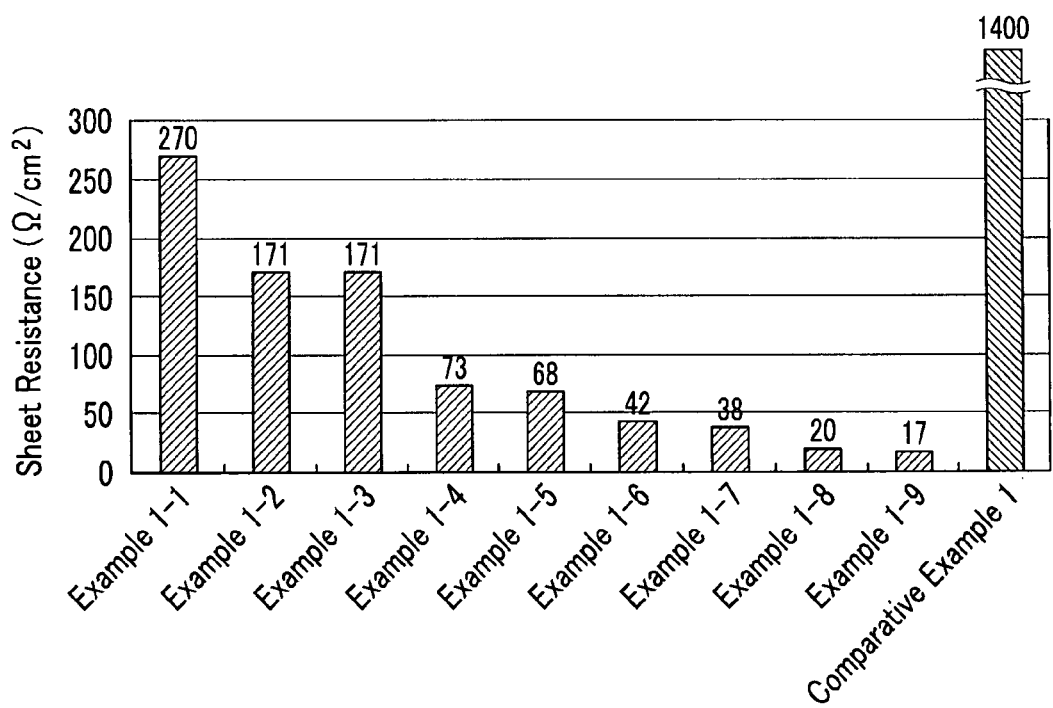
FIG. 4 illustrates a bar graph showing sheet resistance of organic light emitting elements according to Examples 1-1 to 1-9 and Comparative Examples 1 and 2.

FIG. 4 illustrates a bar graph showing sheet resistance of the top electrodes of the organic light emitting elements according to Examples 1-1 to 1-9 and Comparative Examples 1 and 2, with the caveat that follows concerning Comparative Example 2.

TABLE 1

| No. | Sheet resistance ($\Omega/cm^2$) |
|---|---|
| Example 1-1 | 270 |
| Example 1-2 | 171 |
| Example 1-3 | 171 |
| Example 1-4 | 73 |
| Example 1-5 | 68 |
| Example 1-6 | 42 |
| Example 1-7 | 38 |
| Example 1-8 | 20 |
| Example 1-9 | 17 |
| Comparative Example 1 | 1400 |
| Comparative Example 2 | Measurement unavailable |

Referring to Table 1 and FIG. 4, when the top electrode included ytterbium (Yb)-silver (Ag) alloy, the sheet resistances were remarkably decreased, compared with a top electrode including only ytterbium without silver alloyed therewith. Also, when a top electrode including only pure aluminum without ytterbium alloyed therewith was formed to a thickness as thin as about 100 Å, the resistance increased infinitely such that the sheet resistance could not possibly be measured.

Evaluation—2

Sheet resistance of top electrodes of the organic light emitting elements according to Examples 2-1 to 2-4 and Comparative Example 3 was evaluated. The sheet resistance was measured according to the same method as described above.

Figure 5:
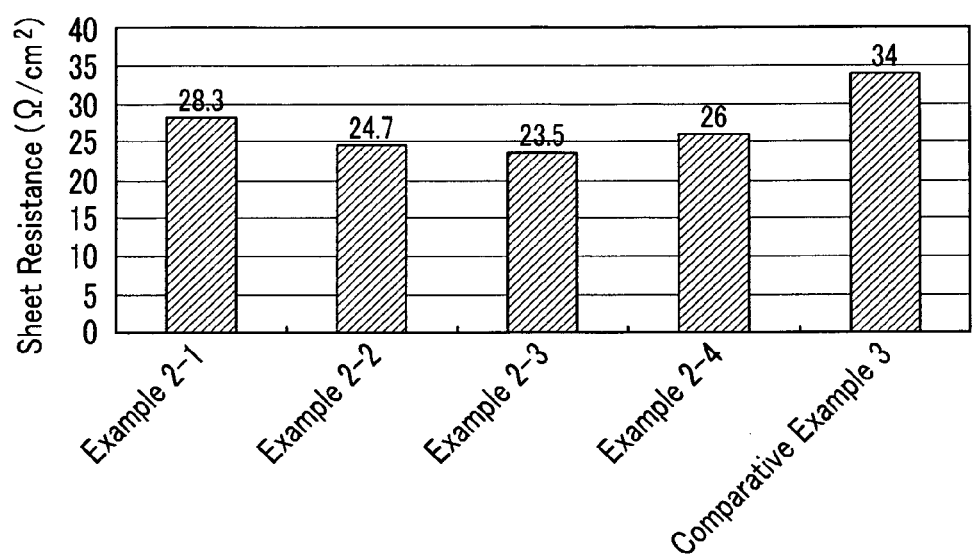
FIG. 5 illustrates a bar graph showing sheet resistance of organic light emitting elements according to Examples 2-1 to 2-4 and Comparative Example 3.

The resistance is illustrated referring to FIG. 5 and Table 2.

FIG. 5 illustrates a bar graph showing sheet resistance of top electrodes of organic light emitting elements according to Examples 2-1 to 2-4 and Comparative Example 3.

TABLE 2

| No. | Sheet resistance ($\Omega/cm^2$) |
| --- | --- |
| Example 2-1 | 28.3 |
| Example 2-2 | 24.7 |
| Example 2-3 | 23.5 |
| Example 2-4 | 26 |
| Comparative Example 3 | 34 |

Referring to Table 2 and FIG. 5, when the top electrode included ytterbium (Yb)-silver (Ag) alloy, sheet resistance was decreased, compared with a case where the top electrode included a stacked structure of ytterbium (Yb) layer/silver (Ag) layer.

Evaluation—3

Light transmittance, reflectance, and absorbance were measured for the top electrode of the organic light emitting elements fabricated according to Example 1-4, Example 2-1, and Comparative Example 3.

This will be described by referring to FIGS. 6A to 8C.

Figure 6A:
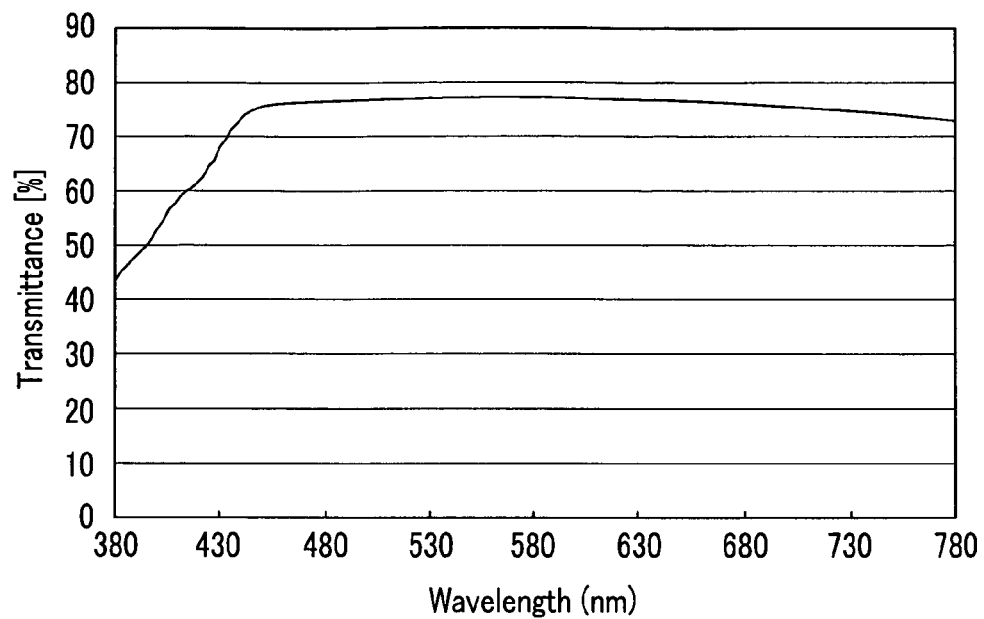
FIGS. 6A to 6C illustrate light transmittance of organic light emitting elements according to Example 1-4, Example 2-1, and Comparative Example 3, respectively.
Figure 6B:
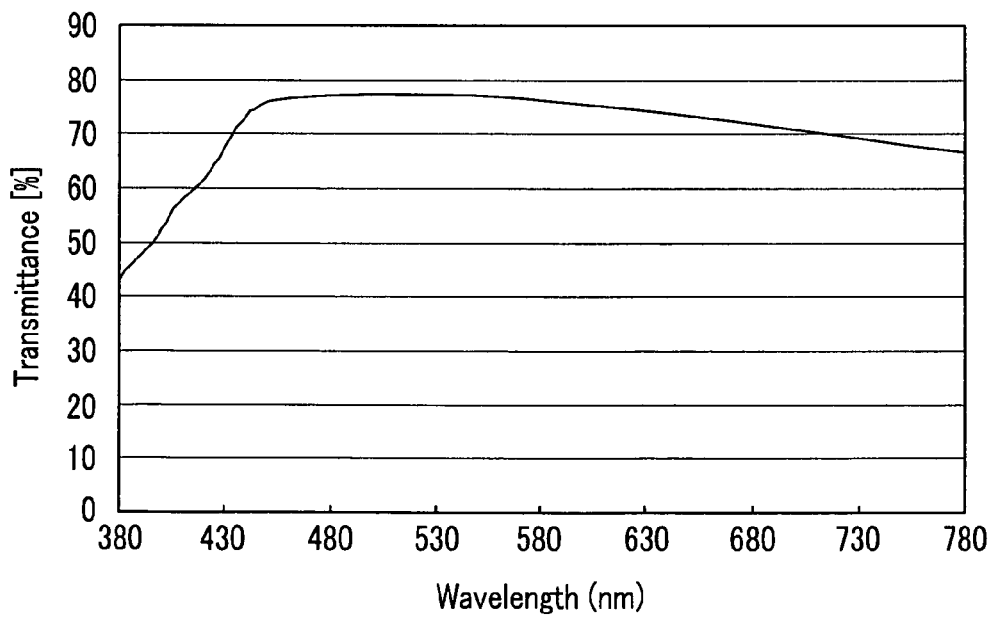
Figure 6C:
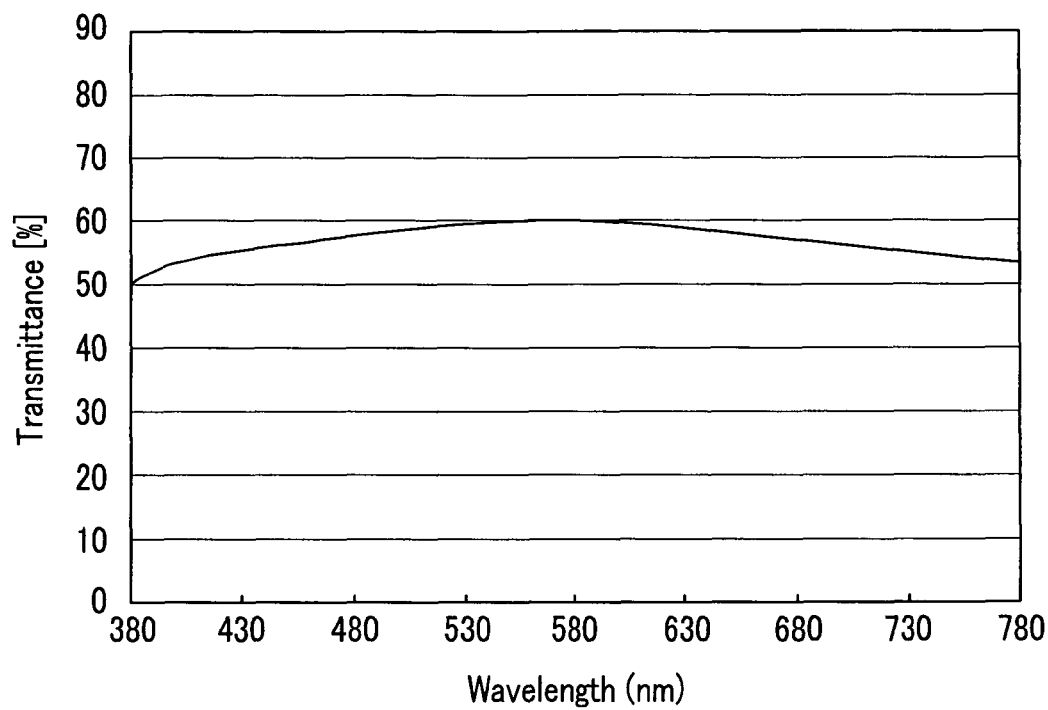
Figure 7A:
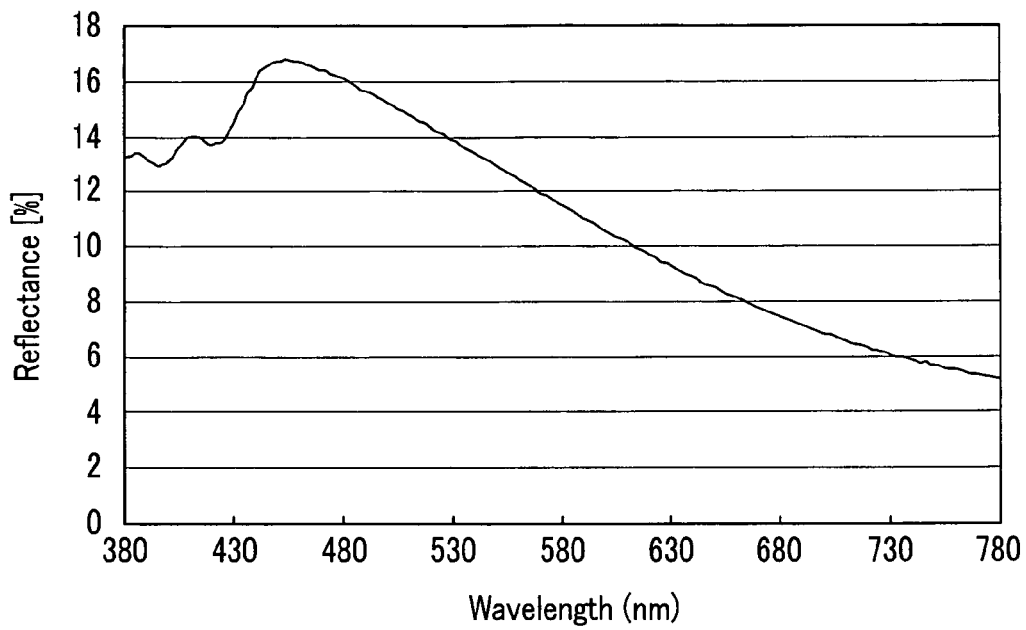
FIGS. 7A to 7C illustrate reflectance of organic light emitting elements according to Example 1-4, Example 2-1, and Comparative Example 3, respectively.
Figure 7B:
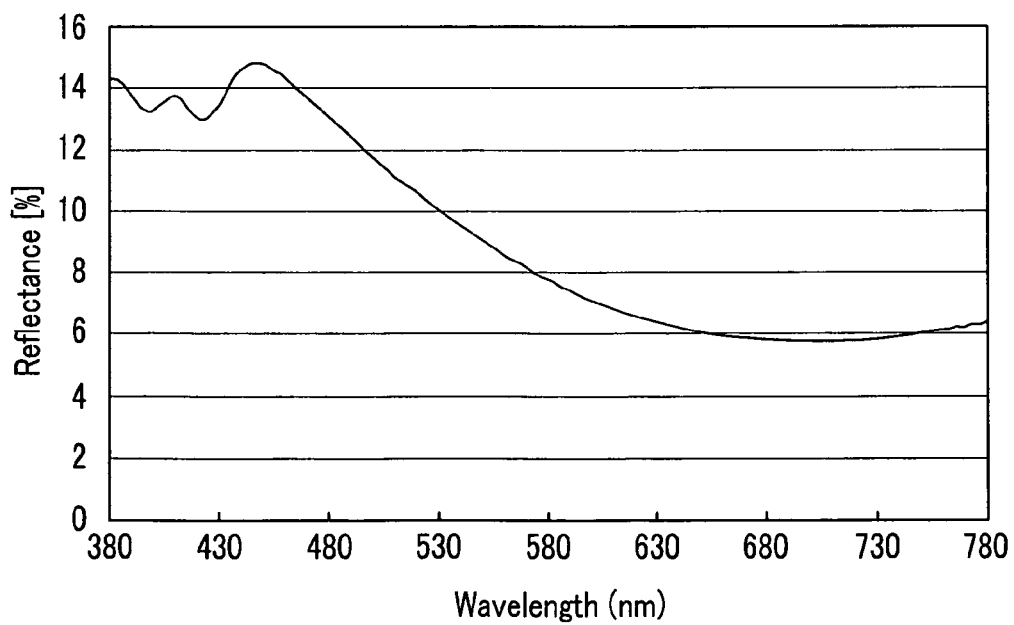
Figure 7C:
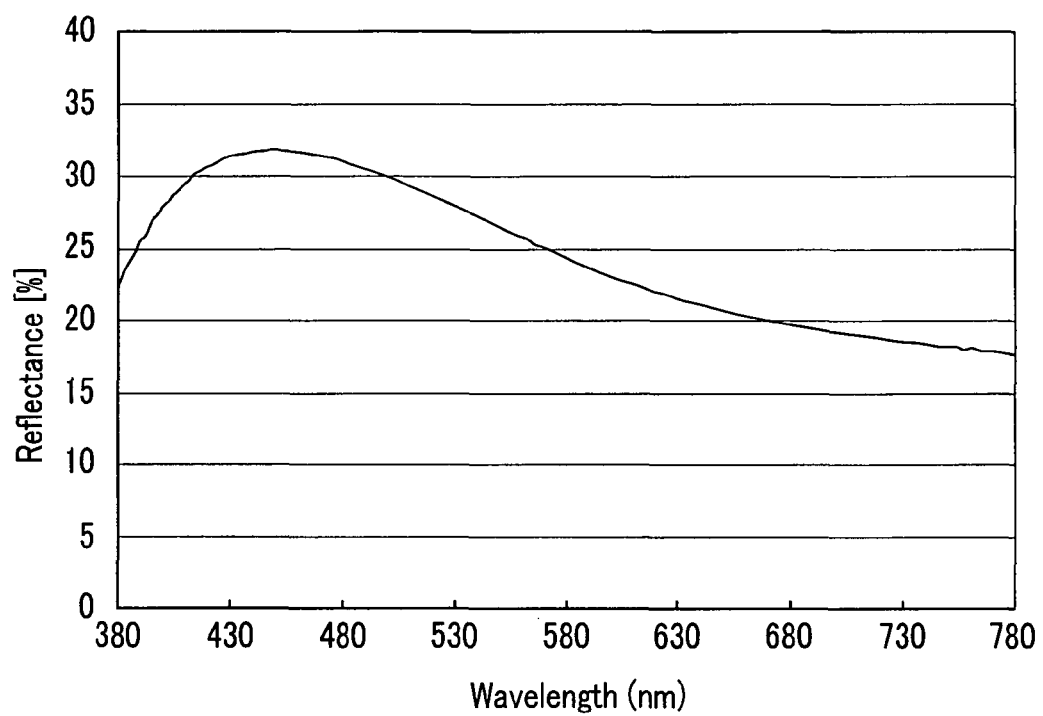
Figure 8A:
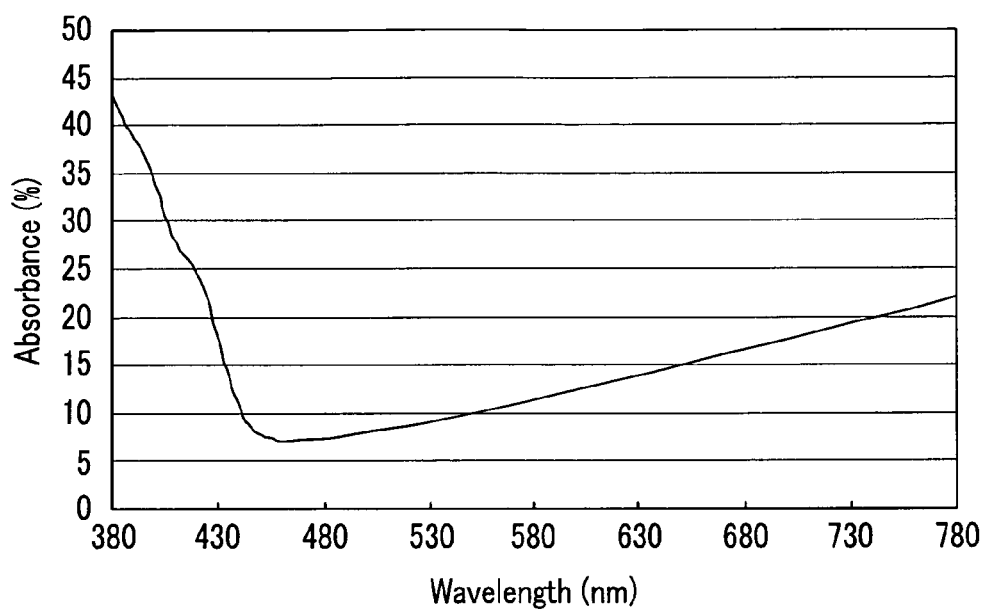
FIGS. 8A to 8C illustrate light absorption of organic light emitting elements according to Example 1-4, Example 2-1, and Comparative Example 3, respectively.
Figure 8B:
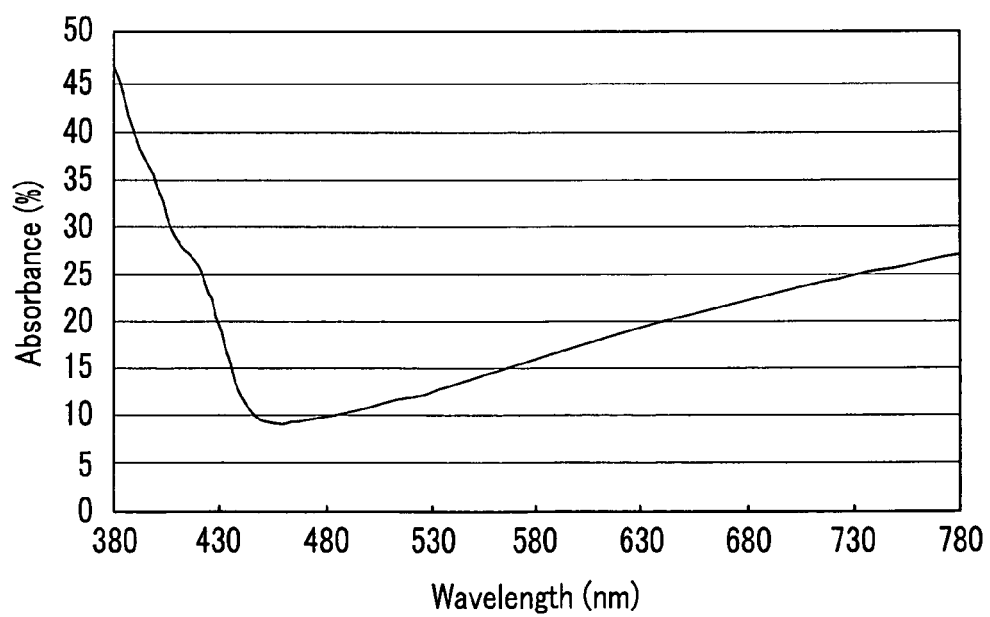
Figure 8C:
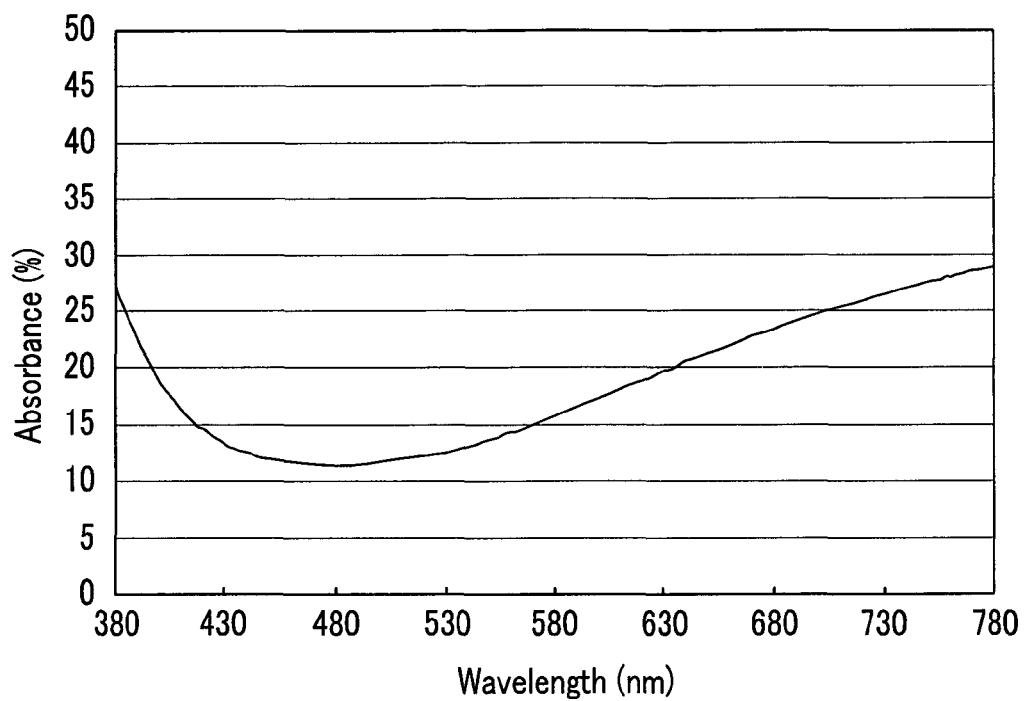

FIGS. 6A to 6C illustrate graphs showing light transmittance of the top electrodes of the organic light emitting elements according to Example 1-4, Example 2-1, and Comparative Example 3, respectively. FIGS. 7A to 7C illustrate graphs showing reflectance of the top electrodes of the organic light emitting elements according to Example 1-4, Example 2-1, and Comparative Example 3, respectively. FIGS. 8A to 8C illustrate graphs showing absorbance of the top electrodes of the organic light emitting elements according to Example 1-4, Example 2-1, and Comparative Example 3, respectively.

Referring to FIGS. 6A to 6C, the top electrodes of the organic light emitting elements fabricated according to Example 1-4 (FIG. 6A) and Example 2-1 (FIG. 6B) exhibited light transmittance of greater than about 70% in the visible ray region. The top electrode of the organic light emitting element fabricated according to Comparative Example 3 (FIG. 6C) exhibited a relatively low light transmittance of only about 50% to 60% in the visible ray region. In particular, in the top electrode of the organic light emitting element fabricated according to Example 1-4, i.e., the top electrode including ytterbium (Yb) and silver (Ag) deposited at a ratio of 1:1, transmittance was the highest.

Referring to FIGS. 7A to 7C, the top electrodes of the organic light emitting elements fabricated according to Example 1-4 (FIG. 7A) and Example 2-1 (FIG. 7B) exhibited reflectance as low as less than about 10% in the visible ray region, particularly in long wavelength regions. The top electrode of the organic light emitting element (FIG. 7C) fabricated according to Comparative Example 2 exhibited a relatively high reflectance of about 15 to about 20% in the long wavelength region. Low reflectance of the electrode may help ensure that efficiency is improved by reducing an amount of light reflected by a surface of the electrode.

Referring to FIGS. 8A to 8C, the top electrodes of the organic light emitting elements fabricated according to Example 1-4 (FIG. 8A) and Example 2-1 (FIG. 8B) exhibited a low light absorbance; and the top electrode of the organic light emitting element fabricated according to Comparative Example 2 (FIG. 8C) exhibited higher light absorbance. The low absorbance of the electrode may help ensure that efficiency is improved by reducing the amount of light absorbed by the electrode.

An organic light emitting element fabricated according to an embodiment may have an improved efficiency, because the reflectance and absorbance are low and the light transmittance is high, compared with the organic light emitting element of a Comparative Example.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode device, comprising
a first electrode;
a second electrode facing the first electrode; and
an emitting layer interposed between the first electrode and the second electrode,
wherein:
the first electrode includes an ytterbium (Yb) alloy represented by the following Chemical Formula 1:

Yb-M (1), in Chemical Formula 1, M is a metal including at least one of silver (Ag), calcium (Ca), chromium (Cr), iron (Fe), cobalt (Co), nickel (Ni), copper (Cu), molybdenum (Mo), ruthenium (Ru), indium (In), and tungsten (W), and
the ytterbium alloy includes Yb and M at a Yb:M ratio of 1:2 to about 1:6.

2. The organic light emitting diode device as claimed in claim 1, wherein the first electrode has a light transmittance of about 40% or greater in a visible ray region.

3. The organic light emitting diode device as claimed in claim 2, wherein the first electrode has a light transmittance of about 40% to about 95% in a visible ray region.

4. The organic light emitting diode device as claimed in claim 1, wherein the first electrode has a sheet resistance of about 500 $\Omega/cm^2$ or less at a thickness of about 50 Å to about 500 Å.

5. The organic light emitting diode device as claimed in claim 4, wherein the first electrode has a sheet resistance of about 1 $\Omega/cm^2$ to about 500 $\Omega/cm^2$ or less at a thickness of about 50 Å to about 500 Å.

6. The organic light emitting diode device as claimed in claim 1, wherein the first electrode has a thickness of about 50 Å to about 500 Å.

7. The organic light emitting diode device as claimed in claim 1, wherein the ytterbium alloy includes an ytterbium-silver alloy (YbAg).

8. The organic light emitting diode device as claimed in claim 1, wherein the second electrode includes a transparent conductive layer.

9. The organic light emitting diode device as claimed in claim 1, wherein the second electrode includes a reflective layer and the emitting layer is configured to emit white light.

10. The organic light emitting diode device as claimed in claim 9, wherein the second electrode further includes a transparent conductive layer.

11. An organic light emitting diode device, comprising:
a first electrode;
a second electrode facing the first electrode; and
an emitting layer interposed between the first electrode and the second electrode, wherein:
the first electrode includes:
a first layer including an ytterbium (Yb) alloy represented by the following Chemical Formula 1:

Yb-M  (1), in Chemical Formula 1, M is a metal including at least one of silver (Ag), calcium (Ca), chromium (Cr), iron (Fe), cobalt (Co), nickel (Ni), copper (Cu), molybdenum (Mo), ruthenium (Ru), indium (In), and tungsten (W), and
a second layer including at least one of silver (Ag), calcium (Ca), chromium (Cr), iron (Fe), cobalt (Co), nickel (Ni), copper (Cu), molybdenum (Mo), ruthenium (Ru), indium (In), tungsten (W), and alloys thereof, and
the first electrode has a light transmittance of about 40% or greater in a visible ray region.

12. The organic light emitting diode device as claimed in claim 11, wherein the first layer has a thickness of about 5 Å to about 200 Å and the second layer has a thickness of about 50 Å to about 300 Å.

13. The organic light emitting diode device as claimed in claim 11, wherein the first electrode has a sheet resistance of about 500 Ω/cm² or less at a thickness of about 50 Å to about 500 Å.

14. The organic light emitting diode device as claimed in claim 11, wherein the ytterbium alloy includes an ytterbium-silver alloy (YbAg).

15. The organic light emitting diode device as claimed in claim 14, wherein the first layer includes the ytterbium-silver alloy (YbAg) and the second layer includes silver (Ag) or a silver alloy.

16. An organic light emitting diode device, comprising:
a first electrode;
a second electrode facing the first electrode; and
an emitting layer interposed between the first electrode and the second electrode,
wherein:
the first electrode includes an ytterbium (Yb) alloy represented by the following Chemical Formula 1:

Yb-M  (1), in Chemical Formula 1, M is a metal including at least one of silver (Ag), calcium (Ca), chromium (Cr), iron (Fe), cobalt (Co), nickel (Ni), copper (Cu), molybdenum (Mo), ruthenium (Ru), indium (In), and tungsten (W), and
the ytterbium alloy includes Yb and M at a Yb:M ratio of 1:2 to about 1:20.

17. The organic light emitting diode device as claimed in claim 16, wherein the first electrode has a light transmittance of about 40% or greater in a visible ray region.

18. The organic light emitting diode device as claimed in claim 16, wherein the first electrode has a sheet resistance of about 500 Ω/cm² or less at a thickness of about 50 Å to about 500 Å.

19. The organic light emitting diode device as claimed in claim 16, wherein the first electrode has a thickness of about 50 Å to about 500 Å.

20. The organic light emitting diode device as claimed in claim 16, wherein the ytterbium alloy includes an ytterbium-silver alloy (YbAg).

* * * * *